United States Patent
Haukka et al.

(10) Patent No.: US 6,858,524 B2
(45) Date of Patent: Feb. 22, 2005

(54) METHOD OF DEPOSITING BARRIER LAYER FOR METAL GATES

(75) Inventors: Suvi Haukka, Helsinki (FI); Hannu Huotari, Espoo (FI)

(73) Assignee: ASM International, NV, Bilthoven (NL)

( * ) Notice: Subject to any disclaimer, the term of this patent is extended or adjusted under 35 U.S.C. 154(b) by 0 days.

(21) Appl. No.: 10/430,811

(22) Filed: May 5, 2003

(65) Prior Publication Data

US 2004/0104439 A1 Jun. 3, 2004

Related U.S. Application Data

(60) Provisional application No. 60/430,960, filed on Dec. 3, 2002.

(51) Int. Cl.[7] ................. H01L 21/3205; H01L 21/4763; H01L 21/44
(52) U.S. Cl. ................. 438/585; 438/592; 438/683
(58) Field of Search ................. 438/585, 230, 438/686, 627, 592, 780, 287, 683

(56) References Cited

U.S. PATENT DOCUMENTS

| | | | |
|---|---|---|---|
| 5,625,217 A | 4/1997 | Chau et al. ................. | 257/412 |
| 5,783,478 A | 7/1998 | Chau et al. ................. | 438/592 |
| 6,066,533 A | 5/2000 | Yu ............................. | 438/275 |
| 6,166,417 A | 12/2000 | Bai et al. .................... | 257/407 |
| 6,225,168 B1 | 5/2001 | Gardner et al. ............. | 438/287 |
| 6,265,258 B1 | 7/2001 | Liang et al. ................ | 438/217 |
| 6,291,282 B1 | 9/2001 | Wilk et al. .................. | 438/203 |
| 6,368,954 B1 * | 4/2002 | Lopatin et al. ............. | 438/627 |
| 6,373,111 B1 | 4/2002 | Zheng et al. ................ | 257/407 |
| 6,383,879 B1 | 5/2002 | Kizilyalli et al. ........... | 438/303 |

(List continued on next page.)

FOREIGN PATENT DOCUMENTS

| | | |
|---|---|---|
| EP | 0854 505 A2 | 7/1998 |
| WO | WO 94/14198 | 6/1994 |
| WO | WO 01/29893 A1 | 4/2001 |
| WO | WO 01/66832 A2 | 9/2001 |
| WO | WO 02/43115 A2 | 5/2002 |
| WO | WO 02/50922 A1 | 6/2002 |

OTHER PUBLICATIONS

Suntola, T. "Atomic Layer Epitaxy", Handbook of Crystal Growth, vol. 3, Chapter 14, NH 1994, pp. 605–663.

(List continued on next page.)

*Primary Examiner*—John F. Niebling
*Assistant Examiner*—Walter L. Lindsay, Jr.
(74) *Attorney, Agent, or Firm*—Knobbe, Martens, Olson & Bear LLP.

(57) ABSTRACT

A method of manufacturing a high performance MOS device and transistor gate stacks comprises forming a gate dielectric layer over a semiconductor substrate; forming a barrier layer over the gate dielectric layer by an ALD type process; and forming a gate electrode layer over the barrier layer. The method enables the use of hydrogen plasma, high energy hydrogen radicals and ions, other reactive radicals, reactive oxygen and oxygen containing precursors in the processing steps subsequent to the deposition of the gate dielectric layer of the device. The ALD process for forming the barrier layer is performed essentially in the absence of plasma and reactive hydrogen radials and ions. This invention makes it possible to use oxygen as a precursor in the deposition of the metal gates. The barrier film also allows the use of hydrogen plasma in the form of either direct or remote plasma in the deposition of the gate electrode. Furthermore, the barrier film prevents the electrode material from reacting with the gate dielectric material. The barrier layer is ultra thin and, at the same time, it forms a uniform cover over the entire surface of the gate dielectric.

19 Claims, 8 Drawing Sheets

U.S. PATENT DOCUMENTS

| | | | |
|---|---|---|---|
| 6,407,435 B1 * | 6/2002 | Ma et al. ................... | 257/411 |
| 6,458,695 B1 | 10/2002 | Lin et al. ..................... | 438/659 |
| 6,482,740 B2 * | 11/2002 | Soininen et al. ............ | 438/686 |
| 6,506,676 B2 * | 1/2003 | Park et al. ................... | 438/683 |
| 6,511,876 B2 * | 1/2003 | Buchanan et al. .......... | 438/240 |
| 6,518,106 B2 * | 2/2003 | Ngai et al. ................... | 438/157 |
| 6,537,901 B2 * | 3/2003 | Cha et al. .................... | 438/592 |
| 6,579,767 B2 * | 6/2003 | Park et al. ................... | 438/287 |
| 6,596,576 B2 * | 7/2003 | Fu et al. ...................... | 438/230 |
| 6,627,503 B2 * | 9/2003 | Ma et al. ..................... | 438/287 |
| 6,696,332 B2 * | 2/2004 | Visokay et al. ............. | 438/216 |
| 6,700,771 B2 * | 3/2004 | Bhattacharyya ............. | 257/310 |
| 6,713,846 B1 * | 3/2004 | Senzaki ....................... | 438/780 |
| 6,714,435 B1 * | 3/2004 | Dimmler et al. ............ | 365/145 |
| 6,717,226 B2 * | 4/2004 | Hegde et al. ................ | 438/261 |
| 6,723,581 B1 * | 4/2004 | Chabal et al. ............... | 438/104 |
| 6,730,163 B2 * | 5/2004 | Vaartstra ...................... | 117/88 |
| 6,730,588 B1 * | 5/2004 | Schinella .................... | 438/592 |
| 2001/0041250 A1 | 11/2001 | Werkhoven et al. | |
| 2002/0008257 A1 | 1/2002 | Barnak et al. | |
| 2002/0096724 A1 | 7/2002 | Liang et al. | |
| 2003/0165615 A1 | 9/2003 | Aaltonen et al. | |

OTHER PUBLICATIONS

Chatterjee et al., "CMOS Metal Replacement Gate Transistors using Tantalum Pentoxide Gate Insulator," IEEE, IEDM, 0–7803–4774–9/98, pp. 777–780 (1998).

Chen et al., "0.18 $\mu$m Metal Gate Fully–Depleted SOI MOSFETs for Advanced CMOS Applications," Symposium on VLSI Technology Digest of Technical Papers, pp. 25–26 (1999).

Ducroquet et al., "Full CMP Integration of CVD TiN Damascene Sub–0.1 $\mu$Metal Gate Devices For ULSI Applications," IEEE Transactions on Eectron Devices, vol. 48, No. 8, pp. 1816–1821 (2001).

Ferguson et al., "Titanium Nitride Metal Gate Electrode: Effect of Nitrogen Incorporation," Advanced Metallization Conference 2001 (AMC 2001), pp. 115–119.

Hobbs et al., "Sub–Quarter Micron CMOS Process for TiN–Gate MOSFETs with TiO2 Gate Dielectric formed by Titanium Oxidation," Advanced Products Research and Development Lab, Symposium on VLSi Technology Digest of Technical Papers, pp. 133–134 (1999).

Maiti et al., "PVD TiN Metal Gate MOSFETs on Bulk Silicon and Fully Depleted Silicon–On–Insulator (FDSOI) Substrates for Deep Sub–Quarter Micron CMOS Technology," IEEE, IEDM, 0–7803–4774–9/98, pp. 781–784 (1998).

Park et al., "Robust Ternary Metal Gate Electrodes for Dual Gate CMOS Devices," IEEE, IEDM, 0–7803–7050–3/02, pp. 671–674 (2001).

Polishchuk, "Dual Work Function Metal Gate CMOS Technology Using Metal Interdiffusion," IEEE Electron Device Letter, vol. 22, No. 9, pp. 444–446 (2001).

Wakabayashi et al., "A Novel W/TiNx Metal Gate CMOS Technology using Nitrogen–Concentration–Controlling TiNx Film," IEEE, IEDM, 0–7803–5410–9/99, pp. 253–256 (1999).

Yagishita et al., "High Performance Damascene Metal Gate MOSFET's for 0.1 $\mu$m Regime," IEEE Transactions on Electron Devices, vol. 47, No. 5, pp. 1028–1034 (2000).

Yagishita et al., "Reduction of Threshold Voltage Deviation in Damascene Metal Gate MOSFET's," IEEE, IEDM, 0–7083–5410–9/99, pp. 257–260 (1999).

Yeo et al., "Dual–Metal Gate CMOS Technology with Ultrathin Silicon Nitride Gate Dielectric," IEEE Electronic Device Letters, vol. 22, No. 5, pp. 227–229 (2001).

Zhong et al., "Electrical Properties of $RuO_2$ Gate Electrodes for Dual Metal Gate Si–CMOS," IEEE Electron Device Letters, vol. 21, No. 12, Dec. 2000, pp. 593–595.

* cited by examiner

METHOD OF DEPOSITING BARRIER LAYER FOR METAL GATES

REFERENCE TO RELATED APPLICATIONS

The present application claims priority benefit under 35 U.S.C. § 119(e) of U.S. provisional application No. 60/430,960 filed Dec. 3, 2002. This application is also related to U.S. application Ser. No. 10/430,703, filed on even date herewith, entitled METHOD OF FORMING AN ELECTRODE WITH ADJUSTED WORK FUNCTION. The disclosure of both references is incorporated herein by reference.

FIELD OF THE INVENTION

This invention relates generally to the field of semiconductor manufacturing and in particular to the field of forming transistor gate stacks in integrated circuits.

BACKGROUND OF THE INVENTION

Semiconductor devices are continuously improved to enhance device performance. For example, both smaller device size and higher speed of operation are highly desirable performance targets. Transistors also have been continuously reduced in size. The ability to construct smaller gate structures for complementary metal oxide semiconductor (CMOS) transistors makes it possible to pack more transistors on the same surface area. With the smaller gate structures, the thickness of the gate dielectric has also substantially decreased to 3 nm and below in today's technologies. The principal elements of a typical MOS device are illustrated in FIG. 1a. The device generally includes a semiconductor substrate 101 on which a gate stack is disposed.

The gate stack typically comprises an interfacial layer 109 between the silicon substrate and the gate dielectric layer, gate dielectric layer 110 and a gate electrode 114 disposed on the gate dielectric layer 110. In some circumstances (such as when using a conventional silicon oxide gate dielectric), the interfacial layer 109 may be absent. The gate electrode 114 acts as a conductor. An input signal is typically applied to the gate electrode 114 via a gate terminal (not shown). Heavily doped source/drain regions 102 are formed in the semiconductor substrate 101 and are connected to source/drain terminals (not shown). A channel region 103 is formed in the semiconductor substrate beneath the gate electrode 114 and separates source/drain regions 102. The channel is typically lightly doped with a dopant of a type opposite to that of the source/drain regions 102. The gate electrode 114 is separated from the semiconductor substrate 101 by the gate dielectric layer 110. The insulating gate dielectric layer 110 is provided to prevent electrical current from flowing directly between the gate electrode 114 and the source/drain regions 102 or the channel region 103.

In the process for producing the gate stack in an IC, the gate dielectric layer is deposited according to any thin film deposition method and the gate electrode is deposited over the dielectric layer. The gate dielectric materials currently investigated are characterized by a high dielectric constant (i.e. high-k material). The gate electrode layer is deposited of a material having low electrical resistance. It is desired that the process for depositing the gate electrode is fast to minimize the time of the manufacturing. Polysilicon is generally used as the gate electrode material. However, problems arise since a depletion layer is formed at the polysilicon-dielectric interface, increasing the equivalent oxide thickness of the gate stack. Therefore, other electrode materials with low resistivity are desired. Furthermore, thin film processes that are compatible with the process for depositing the high-k dielectric layer are needed.

The properties of the transistor critically depend on the thickness and quality of the gate dielectric layer 110. Therefore, the dielectric layer, and even the interfacial layer and the channel region are very sensitive to any impurities diffusing from the gate electrode layer. Furthermore, the gate dielectric layer is exposed to detrimental circumstances, when the process for producing the gate electrode layer comprises use of oxygen or oxygen containing precursors or when use of hydrogen plasma or other method where hydrogen radicals are involved is desired after the deposition of the gate dielectric layer.

In U.S. Pat. No. 6,383,879, Kizilyalli et al. describe the use of a metal etch barrier film, deposited by conventional techniques, between the gate dielectric layer and the gate electrode. However, this gate barrier is a high-k dielectric film, which will despite of its high-k value negativity contribute to the effective electrical thickness of the gate dielectric. In U.S. Pat. No. 6,225,168, Gardner et al. describe formation of a gate dielectric layer and a gate barrier layer by subsequent oxidation and nitridation of a deposited Ti or Ta layer. However, thickness control in this rather complicated process sequence is difficult.

The ultra thin dielectric structure of an interfacial layer and a high-k gate dielectric layer is highly sensitive to oxygen. Oxygen can easily penetrate, for instance through a $HfO_2$ layer of 20–30 Å, increasing the thickness of the interfacial $SiO_2$ layer between the silicon substrate and the high-k dielectric layer. A small increase in thickness of the interfacial $SiO_2$ layer can degrade the equivalent oxide thickness (EOT) enormously.

The deposition of a polysilicon gate electrode directly over the $HfO_2$ gate dielectric damages in part the gate oxide. Therefore, a silicon nitride cap or a silicon oxynitride cap is deposited over the gate oxide. However, such silicon compounds are known to increase the EOT value. In the future, smaller and smaller equivalent oxide thickness (EOT) values are called for and, at the same time, from a process integration point of view a polysilicon gate would be preferred. To avoid the depletion effect caused by polysilicon and the increase in EOT caused by the use of a silicon compound as a barrier, a metal or metal nitride barrier film is desirable over the dielectric instead or a silicon compound layer.

Accordingly, what is needed in the art is a method of forming a gate barrier film on a gate dielectric film that method avoids the problems described above.

SUMMARY OF THE INVENTION

It is an object of the present invention to provide an improved method of manufacturing a high performance MOS device and in particular, high performance transistor gate stacks.

In accordance with one aspect of the present invention, a method is provided for manufacturing semiconductor devices, wherein the method comprises forming a gate dielectric layer over a semiconductor substrate; forming a barrier layer over the gate dielectric layer by an ALD type process; and forming a gate electrode layer over the barrier layer.

In accordance with another aspect of the invention, the preferred embodiments provide a barrier layer between two or more materials. Preferably, one of the materials is a gate dielectric in a semiconductor device and the other of the materials is a gate electrode in a semiconductor device.

The method of the present invention facilitates the use of hydrogen plasma, high energy hydrogen radials and ions, other reactive radicals, reactive oxygen and oxygen-containing reactants in the processing steps subsequent to the deposition of the gate dielectric layer of the device. Such reactants can be advantageous for patterning gate electrodes or for tailoring work function of gate electrodes, particularly for CMOS circuits.

The barrier layer provides several functions and is preferably highly conductive. The barrier layer prevents diffusion of impurities from the gate electrode into the gate dielectric layer. Furthermore, the barrier layer serves to prevent the material underneath the barrier film reacting with the surroundings. For example, it prevents further oxidation of an underlying oxide during subsequent processing and thus prevents a resulting increase in equivalent oxide thickness (EOT). Many of the processes for formation of the gate electrode involve use of oxygen, which increases the thickness of an interfacial layer between the substrate and the gate dielectrics. This is a particular concern when the dielectric material is a good oxygen conductor, such as $HfO_2$.

The barrier layer also serves to protect the dielectric layer from sputtering damage and etch damage during subsequent processing steps or any damage caused by hydrogen plasma, hydrogen radials or any other high-energy ions.

The barrier layer is preferably deposited directly on top of the gate dielectric layer. According to preferred embodiments of the present invention the barrier layer is deposited using an atomic layer deposition (ALD) type process including plasma-enhanced ALD, wherein neither direct plasma is utilized within the deposition chamber, nor highly reactive hydrogen radicals or ions are formed. More specifically, the ALD process for forming the barrier layer is performed essentially in the absence of plasma and reactive hydrogen radials and ions. In the illustrated embodiment, the highest allowed concentration of hydrogen radicals and ions in the reactant vapor is determined as a molar ratio of the hydrogen radicals and ions to the actual reactant. For example, the highest allowed concentration of hydrogen radicals and ions in the reactant vapor may be equal to or less than 10% of the actual reactant. According to one preferred embodiment the method is a thermal ALD method.

The present invention makes it possible to use oxygen as a precursor in the deposition of metal gates that determine the work function of the device in practice. The intervening barrier film also allows the use of hydrogen plasma in the form of either direct or remote plasma in the deposition of the gate electrode over the gate dielectric. It allows the elimination of polysilicon carrier depletion without affecting the work function provided by a polysilicon gate electrode. Furthermore, the barrier film formed according to the preferred embodiments prevents the electrode material from reacting with the gate dielectric material, which would change and eventually destroy the transistor. In all the aforementioned cases, the barrier layer deposited is preferably ultra thin and, at the same time, it forms a uniform cover over the entire surface of the gate dielectric.

Furthermore, the properties of the interface between the gate dielectric layer and the barrier film are easily controlled in the preferred embodiments. As the thickness of the gate dielectric layer scales to 3 nm or below, the properties of the upper gate dielectric interface are significant for the performance of the device.

DETAILED DESCRIPTION OF THE PREFERRED EMBODIMENT

While illustrated in the context of transistor gate stacks, the skilled artisan will readily find application for the principles and advantages disclosed herein to other situations where similar electrical and physical properties at an interface are desired.

Figure 1A:
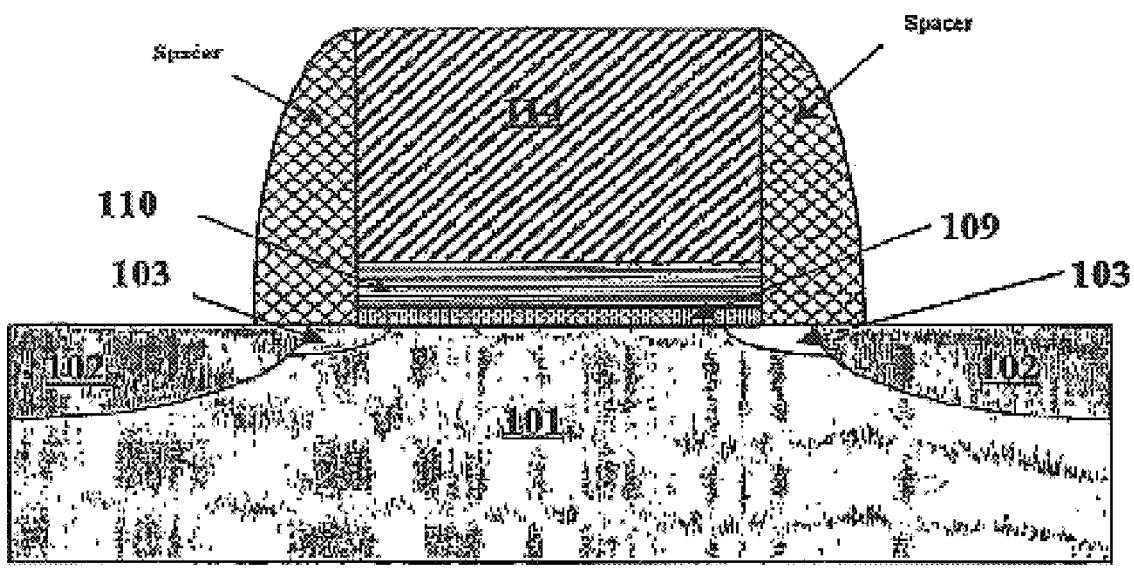
FIG. 1a is a schematic cross-section showing a state of the art transistor gate stack, according to the prior art.
Figure 1B:
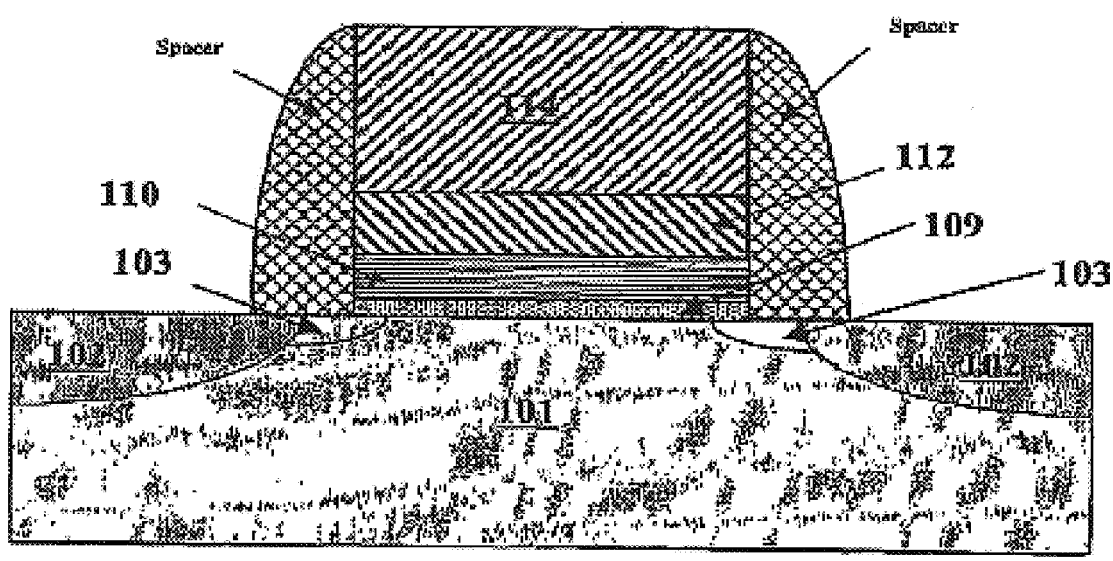
FIG. 1b shows a state of the art gate stack including a gate barrier film, constructed in accordance with a preferred embodiment of the present invention.
Figure 2:
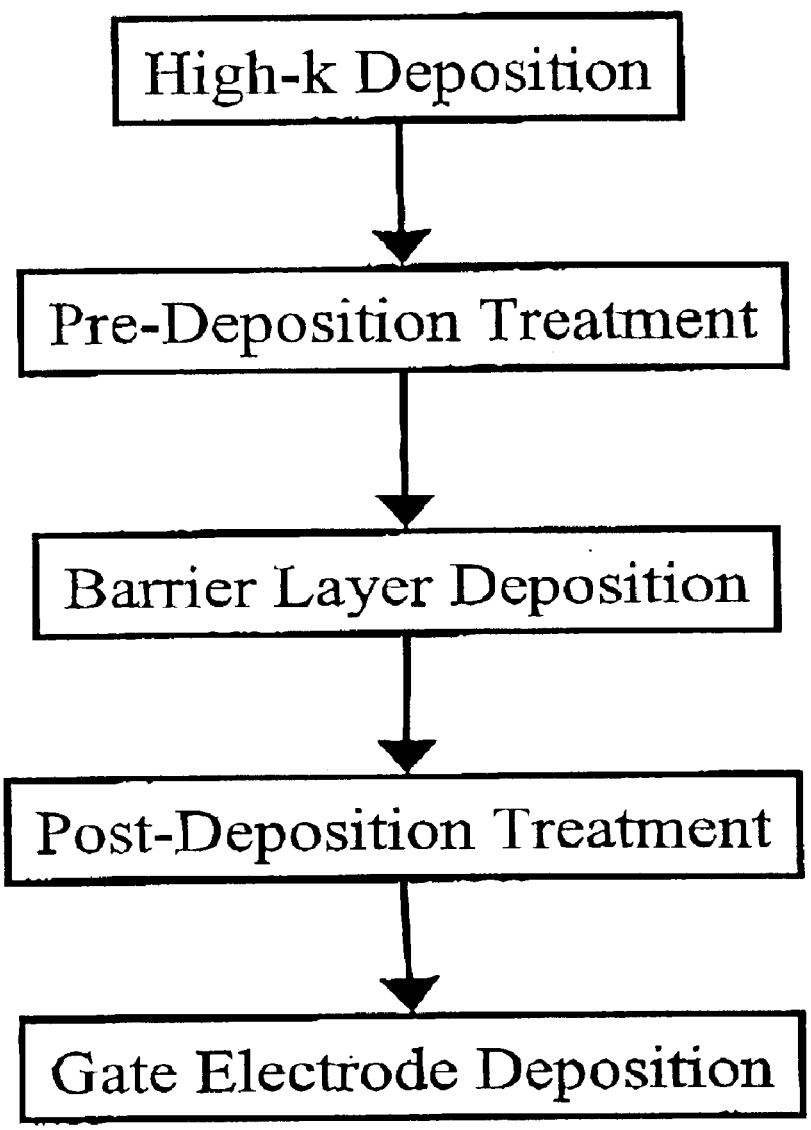
FIG. 2 shows a flow chart generally illustrating the formation of a gate stack comprising a barrier layer between the gate electrode and the high k dielectric in accordance with a preferred embodiment of the invention.

FIG. 1b shows a gate dielectric layer 110 located between an overlying gate electrode 114 and the substrate 101. To improve the reliability of the transistor, the gate dielectric layer 110 is separated from the gate electrode 114 by a gate barrier film 112, as shown in FIG. 1b. Such a barrier film 114 prevents detrimental reactions. Such detrimental reactions may include, but are not limited to, a chemical reaction or a diffusion of impurities, such as molecules, atoms or ions from the solid phase one side of the high-k material to the solid phase on the other side of the high-k material. For example, one concern with high-k dielectric materials, such as $HfO_2$, is their weak properties as diffusion barriers for dopant such as boron. Boron can penetrate through the high-k layer to the transistor channel and change the doping level of the transistor channel.

The barrier layer 112 inhibits the diffusion of impurities from the gate electrode 114 into the gate dielectric layer 110 or even into the channel region 103. For the barrier layer 112 to function effectively as diffusion barrier, at least one molecular layer is desired, preferably between about 1 and 50 molecular layers, more preferably between about 2 and about 20 molecular layers, and most preferably between about 2 and 4 molecular layers.

The barrier layer 112 is highly conductive in order not to increase the effective electrical thickness of the gate dielectric. Examples of suitable materials are TiN, TaN, HfN, $HfSi_xN_y$, $TiSi_xN_y$, $TaSi_xN_y$, WNC and $HfAl_xN_y$ or any other material that forms an efficient barrier and does not react with the underlying gate dielectric material during deposition or during subsequent processing steps. More preferably the barrier layer comprises HfN or $WN_xC_y$.

The substrate 101 typically comprises silicon or GaAs, and can be a wafer or an epitaxial layer. Materials for the gate electrode 114 are well known in the art and include polycrystalline silicon (polysilicon), poly-SiGe, W, TiN, TaN, Al, Ni and Ti. The hotter metals are particularly preferred for circuits in which careful tuning of the work function is needed, e.g., for CMOS circuits in which different transistor gates across the circuit require different work functions.

The gate dielectric layer 110 is typically characterized by a high-k value. The gate dielectric maybe made of any material known in the art. Examples of high-k materials known in the art are hafnium oxide ($HfO_2$), zirconium oxide ($ZrO_2$), titanium dioxide ($TiO_2$), tantalum oxide ($Ta_2O_5$), strontium titanate (ST), barium titanate (BT), barium strontium titanate (BST), lead zirconium titanate (PZT) and strontium bismuth tantalite (SBT). The dielectric layer may comprise multiple materials, for example, a ternary structure or a laminate of multiple layers, such as $Ta_2O_5$—$TiO_2$. Preferred gate dielectrics comprise $ZrO_2$ or $HfO_2$.

An interfacial layer 109 is often present in the substrate and the gate dielectric layer. The interfacial layer typically comprises $SiO_2$ or $SiO_xN_y$ and it is about 5 Å thick (e.g., 3–12 Å). In one embodiment the interfacial layer comprises a native oxide. In another embodiment, the interfacial layer comprises aluminum oxide or lanthanide (rare earth) oxide. Other material and arrangements for the gate stack are well known to the skilled artisan.

The preferred processes for depositing the gate electrode include an ALD process, wherein molecular oxygen is used as a second precursor together with the metal cyclopentadienyl compounds of p-type metals, such as Ru, Pt, or IT (see U.S. patent application Ser. No. 10/066,315, the disclosure of which is incorporated herein by reference). The other processes include also p-type metals like Ni and Co, which are deposited from corresponding metal betadiketonates and ozone with ALD and reduced into elemental metal (see U.S. Pat. No. 6,482,740, the disclosure of which is incorporated herein by reference).

Other preferred processes for producing the gate electrode 114 are thin film processes where direct or remote hydrogen plasma is used. On the other hand, hydrogen plasma has been shown to be detrimental, especially to an ultra thin high k (e.g., $HfO_2$) gate dielectric, which fact has limited the use hydrogen plasma in the deposition processes of metal films as gate electrodes directly on the gate oxide.

The present invention provides a barrier layer between two or more materials. Preferably, one of the materials is a high dielectric constant (high-k) material, such as $HfO_2$ or $ZrO_2$. The high-k material preferably has a dielectric constant greater than 5. More preferably the high-k material has a dielectric constant greater than about 10. Such high-k materials include oxides of group 3 (for example Y, La and Gd), group 4 (Ti, Zr, Hf) and group 5 elements (V, Nb, Ta), as well as more complex oxides. Thus, high-k materials can include lanthanide (rare earth) oxides of group 3 elements, such as yttrium oxide (k'''12), lanthanum oxide (k≈21), neodymium oxide (k≈16), and cerium dioxide (k≈15). In other arrangements, it will be understood that the high-k material can comprise multiple materials, either as a ternary structure or a laminate of multiple high-k material layers.

In context of the present invention, "an ALD type process" generally refers to a process for producing thin films over a substrate, in which process a solid thin film is formed molecular layer by molecular layer due to self-saturating chemical reactions on heated surfaces. In the process, vapor phase reactants, i.e. precursors, are conducted into a reaction chamber of an ALD type of a reactor and contacted with a substrate located in the chamber to provide a surface reaction. The pressure and the temperature of the reaction chamber are adjusted to a range where physisorption (i.e. condensation. of gases) and thermal decomposition of the precursors are avoided. Consequently, only up to one monolayer (i.e. an atomic layer or a molecular layer) of material is deposited at a time during each pulsing cycle. The actual growth rate of the thin film, which is typically presented as Å per pulsing cycle, depends, for example, on the number of available reactive surface sites on the surface and bulkiness of the chemisorbing molecules. Gas phase-reactions between precursors and any undesired reactions of byproducts are inhibited because material pulses are separated from each other by time and the reaction chamber is purged with an inactive gas (e.g. nitrogen or argon) between material pulses to remove surplus gaseous reactants and reaction byproducts from the chamber. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601–663, Elsevier Science B.V. 1994, the disclosure of which is incorporated herein by reference.

In context of the present application, "a reaction space" designates generally a reactor or a reaction chamber in which the conditions can be adjusted so that deposition of a thin film is possible.

In context of the present application, "an ALD type reactor" means a reactor where the reaction space is in fluid communication with an inactive gas source and at least two precursor sources that can be pulsed in alternated steps whereby vapor phase reactants are kept separated, the reaction space is in fluid communication with a vacuum generator (e.g. a vacuum pump), and the temperature and pressure of the reaction space and the flow rates of gases can be adjusted to a range that makes it possible to grow thin films by ALD type processes.

One example of an ALD type process applicable in performing the preferred embodiments is an ALD process utilizing remote plasma. In the process, the plasma is formed outside the reaction chamber and pulsed as a reactant pulse into the reaction chamber. The equipment is configured to optimize neutral excited species delivery and minimize ion delivery to the substrate. However, radicals of the precursor may be present.

"Thermal ALD" refers to an ALD method where plasma is not used for activating reactants but the substrate temperature is high enough for overcoming the energy barrier (activation energy) during collisions between the chemisorbed species on the surface and reactant molecules in the gas phase so that up to a molecular layer of thin film grows on the substrate surface during each ALD pulsing sequence.

The barrier layer 112 is primarily composed of a different material than the gate electrode 114. In one embodiment the barrier layer comprises a metal that is also present in the underlying dielectric layer. For example, the barrier layer 112 may comprise a metal nitride while the dielectric 110 comprises an oxide of the same metal. In a particular embodiment the dielectric layer comprises $HfO_2$ and the overlying layer comprises HfN. In a particular embodiment, a thin HfN barrier layer is deposited immediately after the deposition of $HfO_2$ in the same reaction space.

In a further embodiment, the barrier layer 112 comprises TiN processed by ALD using $TiC_4$ and $NH_3$ the precursors. According to another embodiment, the barrier layer 112 comprises TaN deposited, for instance, using $TaCl_5$, Zn and $NH_3$. Zn is introduced as a separate reducing agent in between the pulse of the metal compound and the pulse of $NH_3$. Instead of zinc, other reducing agents, such as various silicon and boron compounds, can be used. According to one more embodiment of the present invention, the barrier layer 112 comprises tungsten nitride carbide ($WN_xC_y$), which is deposited, for instance, from $WF_6$, triethyl boron (TEB) and $NH_3$, wherein TEB is used as a reducing agent and for gettering halogen from the metal source chemical (e.g. fluorine from absorbed species of $WF_6$).

In other embodiments the barrier layer 112 comprises a nanolaminate structure of a ternary complex. In one embodiment the gate dielectric barrier 112 is a nanolaminate structure comprising a plurality of thin layers of different materials. Preferably, the nanolaminate structure comprises amorphous layers. Nanolaminates similar to those described in WO 01/29893, incorporated herein by reference, could be used.

A barrier layer 112 thicker than about 100 Å will likely affect and possibly even define the work function of the gate. Thus, in terms of absolute thickness, the barrier layer preferably has a thickness of less than or equal to about 100 Å, more preferably less than or equal to about 80 Å and most preferably less than or equal to about 30 Å. However, if it is desired to have the work function determined by the barrier layer 112, a thicker layer, greater than 100 Å may be used. The barrier layer 112 may be thinner than the dielectric layer or thicker than the dielectric layer.

In thermal ALD, the deposition temperature of metals and metal nitrides is typically higher than in the deposition of high-k dielectric layers due to high activation energy required for removing the ligands of the precursors. This leads to a low number of reactive sites on the high-k dielectric surface. In order to provide good surface coverage and to prevent the change in the reaction mode of the metal compound at the beginning of the metal on metal nitride deposition, the first metal-containing pule is preferably conducted before raising the temperature to the desired barrier layer deposition temperature. For instance, in case of TiN deposition from $TiCL_4$ and $NH_3$ the first $TiC_4$ pulse is introduced at the lower temperature than 300° C., more preferably at 250° C. and most preferably below 200° C. during the stabilization time of the high-k surface. After the first pulse the temperature is increased to the final reaction temperature of the TiN process being more 350° C. In extreme case the temperature can also be cycled between the reaction temperature of the metal compound reaction (adsorption) and that of the removing agent of the ligand (ligand gettering or ligand exchange), in this case $NH_3$. One more example is also the deposition of hafnium nitride (HfN). In the reactor for the dielectric growth, the deposition cycle is completed with the $HfCL_4$ pulse and then the temperature is increased to the reaction temperature of the ligand removing agent, in this case $NH_3$, in the same reactor or in a separate reactor.

In one embodiment the surface of the dielectric layer 110 is treated by physical or chemical means prior to the deposition of the barrier layer to modify the surface to better comply with the subsequent processing steps. According to one more embodiment the barrier layer is treated after its deposition to remove impurities incorporated in the layer during the deposition.

Figure 3:
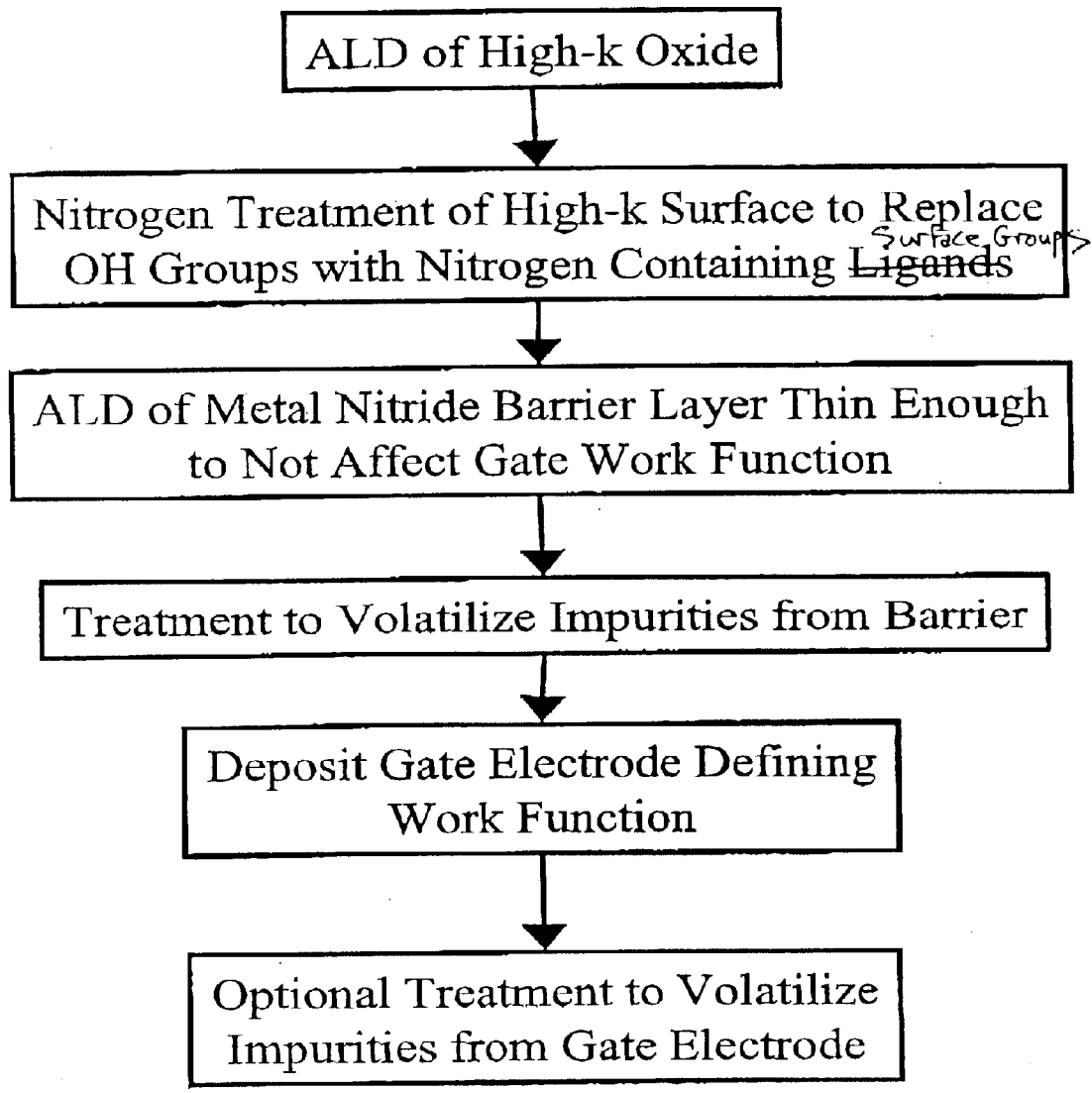
FIG. 3 shows a flow chart of a particular ALD process for the production of a barrier layer between a dielectric layer and a gate electrode, in accordance with another preferred embodiment of the invention.
Figure 4:
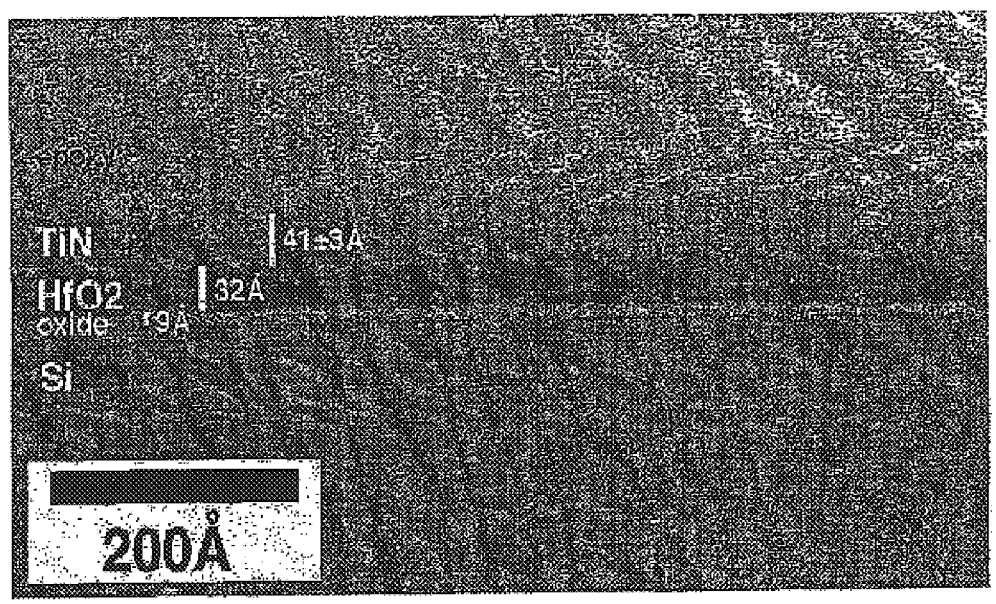
FIG. 4 shows a HRTEM photo of a gate structure that was made by thermal ALD without any pre-deposition treatment of the gate dielectric.
Figure 5:
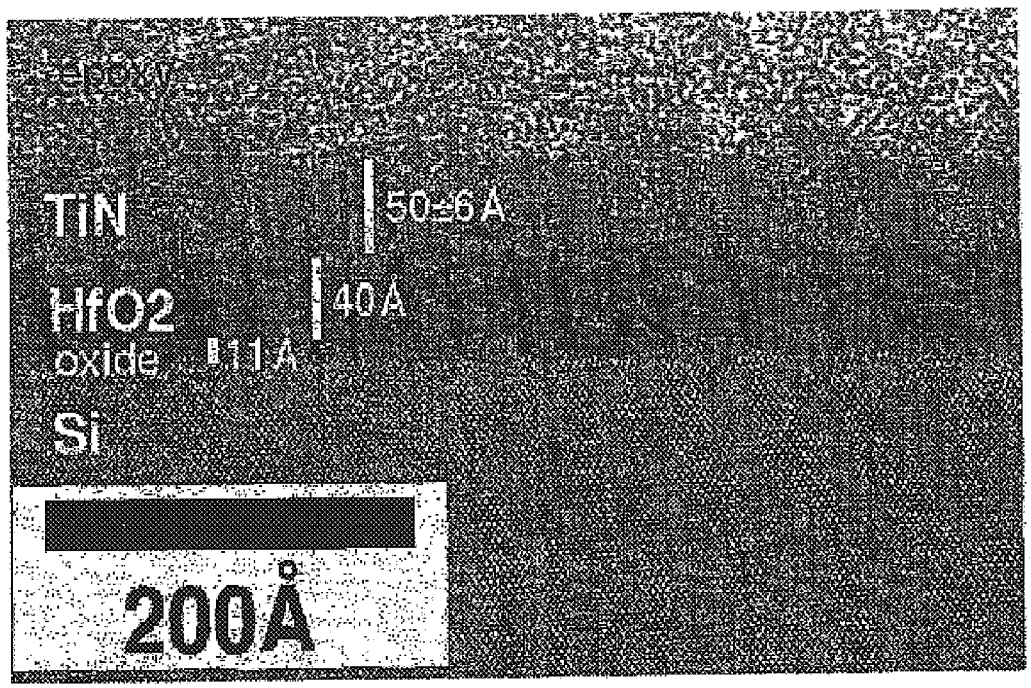
FIG. 5 shows a HRTEM photo of a gate structure that was made by thermal ALD with a $NH_3$ pre-deposition treatment of the gate dielectric.
Figure 6:
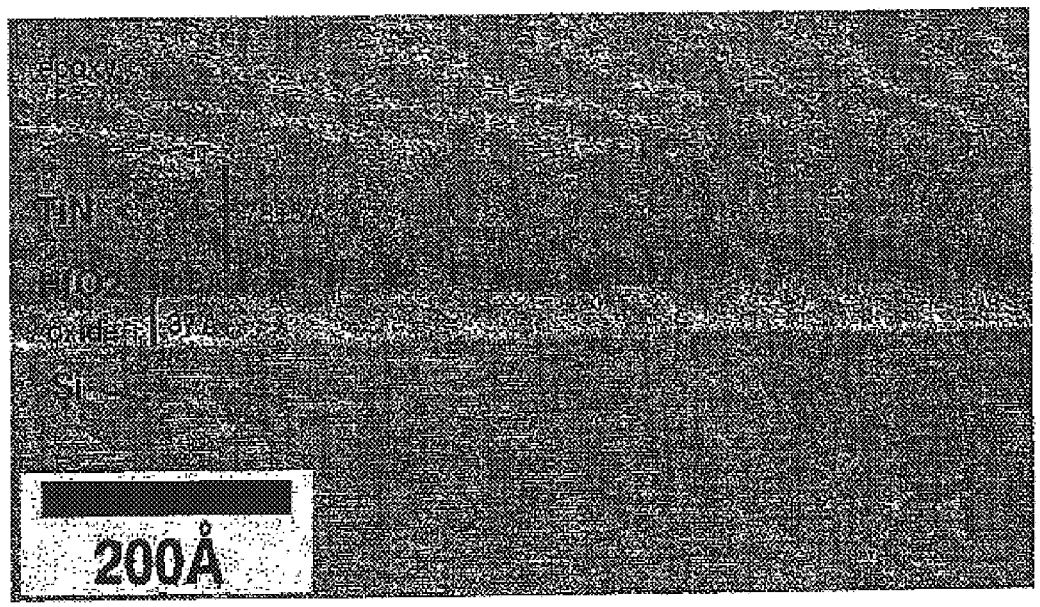
FIG. 6 shows a HRTEM photo of a gate structure that was made by PEALD without any pre-deposition treatment of the gate dielectric.
Figure 7:
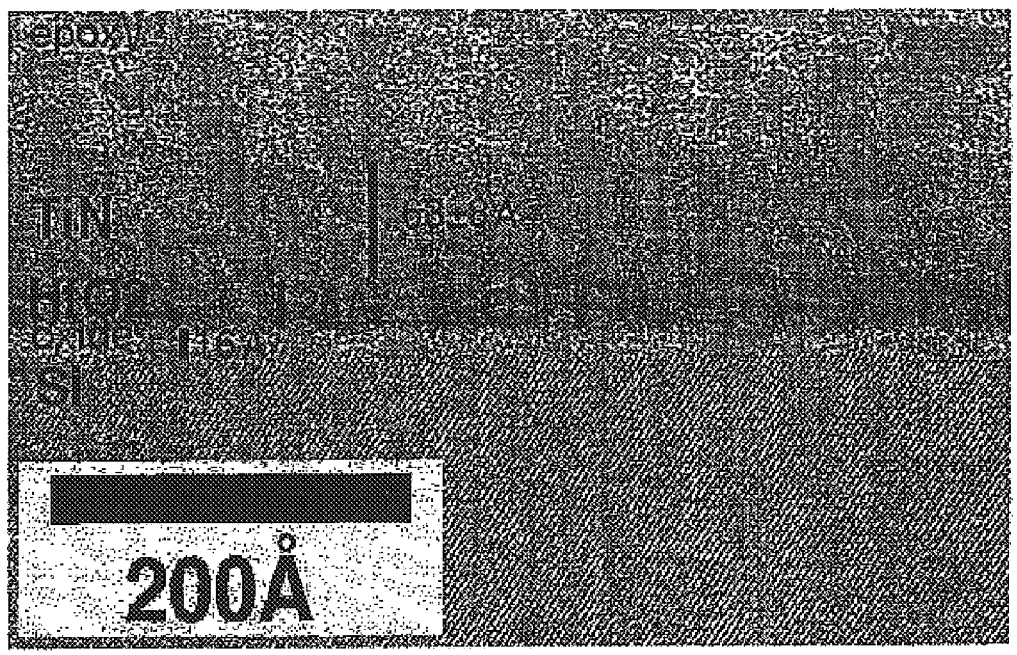
FIG. 7 shows a HRTEM photo of a gate structure that was made by PEALD with nitrogen/hydrogen-plasma pre-deposition treatment of the gate dielectric.

A process flow chart indicating the preferred embodiment with both the pre-deposition treatment and the post-deposition treatment is shown in FIG. 3.

Pre-Deposition Treatment

If the dielectric material comprises an oxide, for example hafnium dioxide ($HfO_2$), the surface of the dielectric layer will comprise reactive hydroxyl (OH) groups. If the subsequent deposition of a barrier layer, such as a metal nitride, is begun by introduction of a metal source chemical pulse (e.g., $TiC_4$), up to amolecular layer of metal oxide will grow on the surface and the equivalent oxide thickness of the dielectric layer increases.

Thus, in one embodiment an oxide dielectric layer is treated to replace OH groups on the surface with N, NH and/or $NH_2$ groups prior to barrier layer deposition. A process flow chart indicating a nitrogen pre-treatment step is shown in FIG. 3. Following such treatment the first metal source chemical pulse will react with the NH and/or $NH_2$ groups on the surface and a metal nitride layer up to one molecular layer will grow on the surface of the dielectric layer. As a result, the equivalent oxide thickness of the high-k layer does not increase. In a particular embodiment a high-k oxide surface is treated with ammonia ($NH_3$) or hydrazine ($N_2H_4$) gas. Preferably, the treatment is continued for about one minute (60 s±10 s) at about 350° C.

The pre-deposition treatment may be part of the process by which the barrier layer is deposited. For example, a TiN barrier film may be deposited from separated $TiCl_4$ and $NH_3$ pulses in an ALD process. The process may be started with a long pulse of $NH_3$, thus replacing the surface OH groups with NH and/or $NH_2$ groups. Preferably the first $NH_3$ pulse is greater than 10 seconds, more preferably greater than 20 seconds (e.g., about 60 seconds) in length. Subsequent $NH_3$ pulses may be of shorter duration.

According to another embodiment the high k oxide surface is treated with radicals. In a particular embodiment the dielectric surface is treated with NH or $NH_2$ radicals for example for greater than 10 seconds, more preferably greater than 20 seconds, (e.g., about 60 seconds). The radicals may be generated, for example, thermally from hydrazine. Surface treatment of high-k dielectrics prior to conductor deposition is described, for example, in U.S. patent application Ser. No. 09/944,734, also published as WO 02/43115, the disclosure of which is hereby incorporated herein by reference.

Post-Deposition Treatment

The gate dielectric barrier may comprise impurities following its formation. For example, if the barrier comprises a metal nitride that was deposited from a metal halide, the metal nitride film may contain some halide impurities. If a metal nitride film was deposited from organometallic source chemicals, the film may contain some carbon impurities that have not formed conductive carbides with metals. Impurities may be removed from the barrier layer material by post-deposition treatment.

A process flow chart indicating the post-treatment step to volatilize impurities from the barrier layer is shown in FIG. 3. In one embodiment a metal nitride layer is treated with hydrogen plasma to remove residual halides and/or carbon. According to another embodiment, a metal nitride barrier layer is annealed at a temperature that is higher than the deposition temperature of the metal nitride and is lower than the crystallization temperature of the metal nitride. Ammonia ($NH_3$) gas can optionally be present in the gas phase during annealing so that volatile impurities more efficiently leave the gate dielectric barrier.

Following the deposition of the gate dielectric barrier layer, a gate electrode is deposited by any method known in the art, including CVD, PVD, ALD, etc. The gate electrode may comprise some impurities following its formation, particularly if metal halide or organometallic source chemicals are used. As discussed above for the barrier layer, these impurities may be removed by optional plasma treatment and/or annealing following the gate electrode deposition. In one embodiment, formation of the gate electrode included incorporation of oxygen into the layer to tailor work function, as disclosed in the application entitled METHOD OF FORMING AN ELECTRODE WITH ADJUSTED WORK FUNCTION, the disclosure of which is incorporated herein above under the heading "Reference to Related Applications."

EXAMPLE

Substrates consisted of wafers that had native oxide on the silicon surface, the native oxide comprising a thin chemical silicon oxide made with an IMEC-clean®. Hafnium dioxide thin films having thickness of 3–5 nm were deposited at 300° C. by thermal ALD on the substrates.

Titanium nitride (TiN) barrier thin films were deposited on top of the atomic layer deposited hafnium dioxide thin films (FIGS. 4–7). The TiN thin films were deposited in a Pulsar®2000 ALCVD™ reactor (ASM Microchemistry Oy of Espoo, Finland). In one set of experiments, TiN was deposited by thermal ALD from titanium tetrachloride ($TiCl_4$) and ammonia ($NH_3$) at higher temperatures, preferably 350° C. In another set of experiment TiN was deposited by plasma enhanced ALD using $TiCl_4$ and nitrogen/hydrogen remote plasma at lower temperatures. The thin films were characterized using standard techniques.

The average growth rate of titanium nitride deposited by thermal ALD was 0.02 nm/cycle. Films were very uniform and had a stoichiometry of $TiN_{1.10}$. There was about 0.5-atomic-% of residual chlorine in the films. Films were oxidized in the air up to a depth of approximately 25 nm, with a resulting oxygen concentration of about 30 atomic-% at the film surface. Films were polycrystalline cubic titanium nitride. It was observed that 5 nm thick films consisted of many different crystal orientation phases and also amorphous phases. Thicker films (over 50 nm) consisted primarily of <111> crystal orientation. Resistivity was found to depend on the thickness of the film and varied from about 440 $\mu\Omega$cm to about 1600 $\mu\Omega$cm.

The average growth rate of titanium nitride films deposited by remote plasma ALD was about 0.03 nm/cycle. The films comprised from about 2 to about 6 atomic-% of residual chlorine. The concentration of titanium in the films was approximately 50 atomic-% indicating nearly stoichiometric TiN. Films comprised polycrystalline cubic titanium nitride. Even 5 nm thick films were very crystalline despite the low growth temperature. Thicker films (over 50 nm) consisted mostly of <200> crystal orientation. Resistivity of the films varied in the range of 170 $\mu\Omega$cm to about 430 $\mu\Omega$cm.

The work function of the titanium nitride electrode was determined to be 4.8 eV. Full coverage of titanium nitride on the hafnium dioxide surface was achieved within about 10 to about 20 deposition cycles.

Although this invention has been described in terms of certain preferred embodiments, other embodiments that are apparent to those of ordinary skill in the art are also within the scope of this invention. It will be appreciated by those skilled in the art that various omissions, additions and modifications may be made to the processes described above without departing from the scope of the invention, and all such modifications and changes are intended to fall within the scope of the invention, as defined by the appended claims.

We claim:

1. A method of manufacturing a gate stack in an integrated circuit comprising:

depositing a gate dielectric layer over a semiconductor substrate;

depositing a barrier layer over the gate dielectric layer by an atomic layer deposition (ALD) type process essentially in the absence of direct plasma, reactive hydrogen radicals and ions; and depositing a gate electrode over the barrier layer.

2. The method of claim 1, wherein the barrier layer comprises a conductive material.

3. The method of claim 1, wherein the barrier layer comprises a metal that is present in the dielectric layer.

4. The method of claim 1, wherein the barrier layer is a metal nitride.

5. The method of claim 4, wherein the barrier layer comprises a material selected from the group consisting of TiN, TaN, and HfN.

6. The method of claim 4, additionally comprising annealing the metal nitride layer.

7. The method of claim 1, wherein the barrier layer comprises an alloy of a group IV element and a second metal, and nitrogen.

8. The method of claim 7, wherein the barrier layer comprises a material selected from the group consisting of $HfSi_xN_y$, $TiSi_xN_y$, $TaSi_xN_y$, $WN_xC_y$ and $HfAl_xN_y$.

9. The method of claim 1, wherein the barrier layer has a thickness equal to or less than 80 Å.

10. The method of claim 9, wherein the thickness of the barrier layer is equal to or less than 30 Å.

11. The method of claim 1, wherein the gate dielectric is a metal oxide.

12. The method of claim 11, wherein the barrier film comprises a material containing nitrogen, the method further comprising the step of treating the gate dielectric with a nitrogen containing gas prior to the depositing of the barrier film.

13. The method of claim 12, wherein treating the gate dielectric with a nitrogen containing gas comprises treating the dielectric layer with ammonia gas.

14. The method of claim 13, wherein the gate dielectric is $HfO_2$ and the barrier film is HfN.

15. The method of claim 12, wherein treating the gate dielectric with a nitrogen containing gas comprises treating the dielectric layer with nitrogen containing radicals.

16. The method of claim 12, wherein the barrier layer comprises a metal nitride including, a metal of the metal oxide of the gate dielectric layer.

17. The method of claim 1, wherein the ALD type process is plasma enhanced ALD utilizing a remote plasma.

18. The method of claim 1, wherein the ALD type process is a thermal ALD process.

19. The method of claim 1, additionally comprising treating the dielectric layer to remove OH groups on the surface prior to depositing of the barrier layer.

* * * * *